(12) United States Patent
Yamatoya et al.

(10) Patent No.: US 11,552,451 B2
(45) Date of Patent: Jan. 10, 2023

(54) SEMICONDUCTOR LASER DEVICE

(71) Applicant: Mitsubishi Electric Corporation, Tokyo (JP)

(72) Inventors: Takeshi Yamatoya, Tokyo (JP); Takashi Nagira, Tokyo (JP); Shinya Okuda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 333 days.

(21) Appl. No.: 16/975,210

(22) PCT Filed: May 28, 2018

(86) PCT No.: PCT/JP2018/020336
§ 371 (c)(1),
(2) Date: Aug. 24, 2020

(87) PCT Pub. No.: WO2019/229799
PCT Pub. Date: Dec. 5, 2019

(65) Prior Publication Data
US 2020/0403380 A1  Dec. 24, 2020

(51) Int. Cl.
*H01S 5/227*   (2006.01)
*H01S 5/026*   (2006.01)
*H01S 5/22*    (2006.01)

(52) U.S. Cl.
CPC ............ *H01S 5/227* (2013.01); *H01S 5/0265* (2013.01); *H01S 5/2206* (2013.01)

(58) Field of Classification Search
USPC ...................................................... 372/34.01
See application file for complete search history.

(56) References Cited

U.S. PATENT DOCUMENTS 6,021,148 A   2/2000   Matsumoto et al.
6,026,106 A   2/2000   Suzuki et al.
(Continued)

FOREIGN PATENT DOCUMENTS

CN   1893209 A      1/2007
EP   1 764 887 A1   3/2007
(Continued)

OTHER PUBLICATIONS

An Office Action mailed by China National Intellectual Property Administration dated Dec. 15, 2021 which corresponds to Chinese Patent Application No. 201880093701.0 and is related to U.S. Appl. No. 16/975,210 with English language translation.
(Continued)

*Primary Examiner* — Tuan N Nguyen
(74) *Attorney, Agent, or Firm* — Studebaker & Brackett PC

(57) ABSTRACT

A semiconductor laser device includes a laser section and a modulator section. The laser section has: a first mesa stripe which is formed on a semiconductor substrate; semi-insulative burying layers which are placed to abut on both side surfaces of the first mesa stripe and are formed on the semiconductor substrate; n-type burying layers formed on respective surfaces of the semi-insulative burying layers; and a p-type cladding layer which covers surfaces of the n-type burying layers and the first mesa stripe. The modulator section has: a second mesa stripe which is formed on the semiconductor substrate; semi-insulative burying layers which are placed to abut on both side surfaces of the second mesa stripe and are formed on the semiconductor substrate; and a p-type cladding layer which covers surfaces of the semi-insulative burying layers and the second mesa stripe.

20 Claims, 9 Drawing Sheets

(56) References Cited

U.S. PATENT DOCUMENTS

| | | | |
|---|---|---|---|
| 6,219,366 B1 | 4/2001 | Furushima | |
| 2001/0010701 A1* | 8/2001 | Furushima | H01S 5/10 438/31 |
| 2007/0041411 A1* | 2/2007 | Pallec | H01S 5/0265 372/50.1 |

FOREIGN PATENT DOCUMENTS

| | | |
|---|---|---|
| JP | H03-192787 A | 8/1991 |
| JP | H10-261831 A | 9/1998 |
| JP | H10-308556 A | 11/1998 |
| JP | H10-326942 A | 12/1998 |
| JP | H10-335751 A | 12/1998 |
| JP | H11-112100 A | 4/1999 |
| JP | 2008-227154 A | 9/2008 |

OTHER PUBLICATIONS

International Search Report issued in PCT/JP2018/020336; dated Aug. 7, 2018.

* cited by examiner

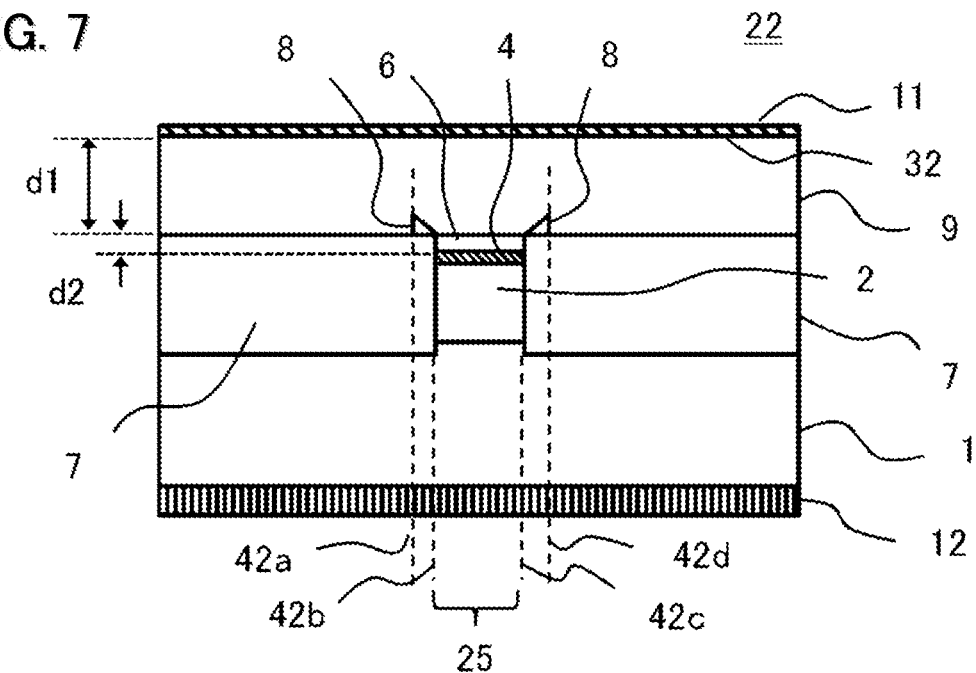
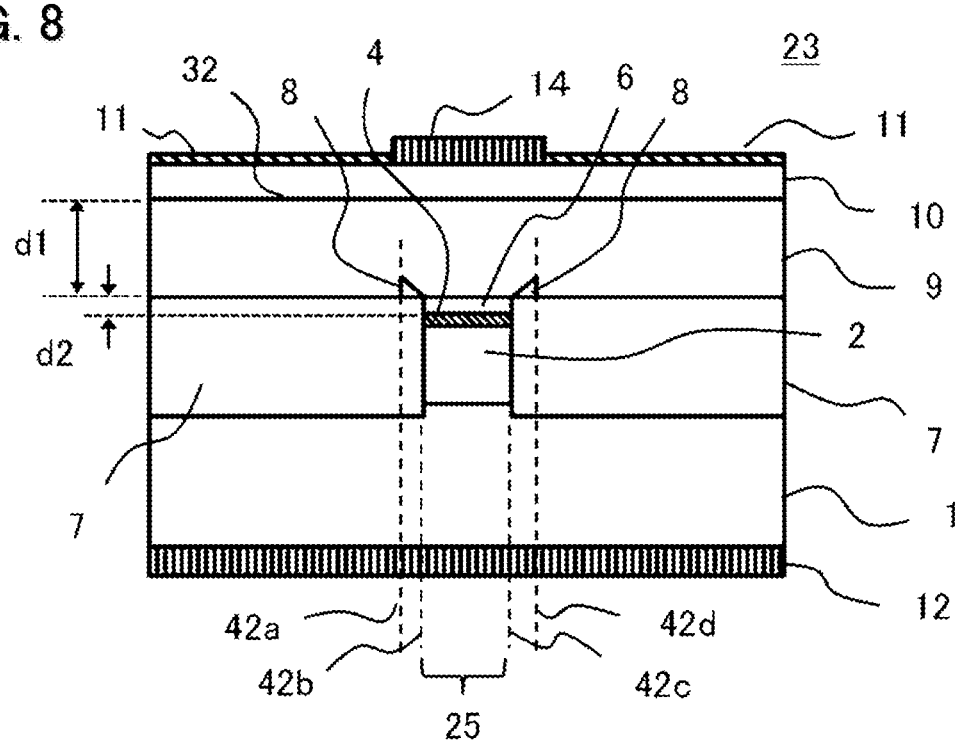

SEMICONDUCTOR LASER DEVICE

TECHNICAL FIELD

The present application relates to a semiconductor laser device which is to be used in optical communications and in which an electro-absorption modulator and a semiconductor laser are integrated together.

BACKGROUND ART

As a semiconductor laser device in which an electro-absorption (EA) modulator and a semiconductor laser, of a buried type, are integrated together, such a device has been developed that employs an Fe(iron)-doped semi-insulative semiconductor layer (Fe—InP layer) as a burying layer (see, for example, Patent Document 1 and Patent Document 2). In FIG. 33 (conventional example) of Patent Document 2, there is disclosed a semiconductor laser device in which, with respect to a mesa structure portion in each of a semiconductor laser section (Region I), a separation section (Region II) and a modulator section (Region III), both sides thereof are buried by Fe-doped InP semi-insulative semiconductor layers (semi-insulative semiconductor layers) and n-type InP hole-trapping layers (n-type burying layers), and the surfaces of the n-type InP hole-trapping layers (their surfaces on a side opposite to that facing an n-type InP semiconductor substrate) and the surface of the mesa structure portion are covered with a p-type InP cladding layer (P-type cladding layer). The n-type InP hole-trapping layers are used for preventing hole injection from the p-type InP cladding layer into the Fe-doped InP semi-insulative semiconductor layers, to thereby improve the laser efficiency.

As the first example (FIG. 1) of Patent Document 1, there is disclosed an integrated optical modulator (semiconductor laser device) in which: in a laser region (laser section), both side surfaces of the mesa stripe are buried by Fe-doped InP high-resistance blocking layers (semi-insulative semiconductor layers), and the surfaces of n-type InP buffer layers (n-type burying layers) (their surfaces on a side opposite to that facing an n-InP substrate) and the surface of the mesa stripe are covered with a p-type InP layer (p-type cladding layer); whereas, in a modulation region (modulator section), both side surfaces of the mesa stripe are only buried by Fe-doped InP high-resistance blocking layers. The n-type InP buffer layers in the laser region (laser section) are used for preventing light-output saturation due to injection of holes from the P-type InP layer into the Fe-doped InP high-resistance blocking layers, namely, for improving the laser efficiency.

As the second example (FIG. 2) of Patent Document 1, there is disclosed an integrated optical modulator (semiconductor laser device) in which, in each of the laser region (laser section) and the modulation region (modulator section), both side surfaces of the mesa stripe are buried by Fe-doped InP high-resistance blocking layers (semi-insulative semiconductor layers), and the surface of the mesa stripe and portions of the Fe-doped InP high-resistance blocking layers adjacent to the mesa stripe, are covered with partially-removed n-type InP buffer layers (n-type burying layers) and a p-type InP layer (p-type cladding layer). The structure of the n-type InP buffer layers and the p-type InP layer, is such a structure in which the n-type InP buffer layers are formed at around the surface-perimeter portions of the mesa stripe and on the surfaces of the Fe-doped InP high-resistance blocking layers outside the surface-perimeter portions; and the p-type InP layer covers the surface-central portion of the mesa stripe and the surfaces of the n-type InP buffer layers.

CITATION LIST

Patent Document

Patent Document 1: Japanese Patent Application Laid-open No. H03-192787 (FIG. 1, FIG. 2)
Patent Document 2: Japanese Patent Application Laid-open No. H10-335751 (FIG. 33)

SUMMARY OF INVENTION

Problems to be Solved by Invention

According to the conventional example represented by the semiconductor laser device of Patent Document 2, both sides of the mesa structure portion are covered with the Fe-doped InP semi-insulative semi-conductor layers (semi-insulative semiconductor layers), and the respective surfaces of the Fe-doped InP semi-insulative semiconductor layers are covered with the n-type InP hole-trapping layers (n-type burying layers), to thereby make improvement in the laser efficiency. However, there is a problem that the n-type InP hole-trapping layers (n-type burying layers) in the modulator section induce parasitic capacitances at their interfaces with the overlying p-type InP cladding layer (p-type cladding layer), so that the high-frequency characteristic is degraded.

The semiconductor laser device (integrated optical modulator) as the first example of Patent Document 1 has a structure not having the n-type InP buffer layers (n-type burying layers) in the modulator section (modulator region). Thus, even though the p-InP cladding layer (p-type cladding layer) is placed on an upper side in the laser region (laser section), the total parasitic capacitances in the device between the n-type InP buffer layers (n-type burying layers) and the p-InP cladding layer (p-type cladding layer) could be reduced. However, since a level difference is formed between the laser region (laser section) and the modulation region (modulator section), there is a problem that an optical loss occurs due to the level difference; and the current blocking effect in the laser region (laser section) is weak due to that the n-type InP buffer layers (n-type burying layers) in the laser region (laser section) are placed at positions higher than the p-InP cladding layer (p-type cladding layer) in the modulation region (modulator section), and are thus apart from the laser active layer; so that the light-output efficiency relative to an injected current is poor.

Further, according to a structure in which, like in the semiconductor laser device as the second example of Patent Document 1, the mesa stripe is formed in the modulator section and the n-type buffer layers (n-type burying layers) are partially removed, the parasitic capacitance between each of the n-type InP buffer layers (n-type burying layers) and the p-type InP layer (p-type cladding layer) in the modulator section could be reduced in comparison with the conventional example represented by the semiconductor laser device of Patent Document 2; however, a large parasitic capacitance still remains, so that the high-frequency characteristic is not improved sufficiently.

A technique disclosed in the present description has been made to solve the problems as described above, and an object thereof is to achieve a semiconductor laser device in which the parasitic capacitance in the modulator section, between a burying layer for burying the mesa stripe which includes the semi-insulative semiconductor layer, and the p-type cladding layer, is small or absent; and in which the optical loss at a portion where the laser section is connected with the modulator section is small, so that the light-output efficiency relative to an injected current is high.

Means for Solving Problems

In a semiconductor laser device disclosed as an example in the present description, a laser section and a modulator section are formed on a same semiconductor substrate. The laser section has: a first mesa stripe which is provided as a mesa formed on the semiconductor substrate and extending in a direction of an optical axis of laser light to be emitted by the laser section, and which includes an active layer; semi-insulative burying layers which are placed to abut on both side surfaces of the first mesa stripe and are formed on the semiconductor substrate; n-type burying layers formed on respective surfaces of the semi-insulative burying layers; and a p-type cladding layer which covers surfaces of the n-type burying layers and the first mesa stripe. The modulator section has: a second mesa stripe which is provided as a mesa formed on the semiconductor substrate and extending in the direction of the optical axis, and which includes an absorption layer; semi-insulative burying layers which are placed to abut on both side surfaces of the second mesa stripe and are formed on the semiconductor substrate; and a p-type cladding layer which covers surfaces of the semi-insulative burying layers and the second mesa stripe.

Effect of Invention

According to a semiconductor laser device disclosed as an example in the present description, since the p-type cladding layer in the modulator section covers the surfaces of the semi-insulative burying layers and the second mesa stripe, it is possible to make the parasitic capacitance in the modulator section, between the burying layer for burying the mesa stripe which includes the semi-insulative semiconductor layer, and the p-type cladding layer, smaller than that in the conventional case, and to make the optical loss small to thereby enhance the light-output efficiency.

BRIEF DESCRIPTION OF DRAWINGS

FIG. 7 is a cross-sectional view of a separation section in the semiconductor laser device of FIG. 5.

FIG. 8 is a cross-sectional view of a modulator section in the semiconductor laser device of FIG. 5.

MODES FOR CARRYING OUT INVENTION

Embodiment 1

Figure 1:
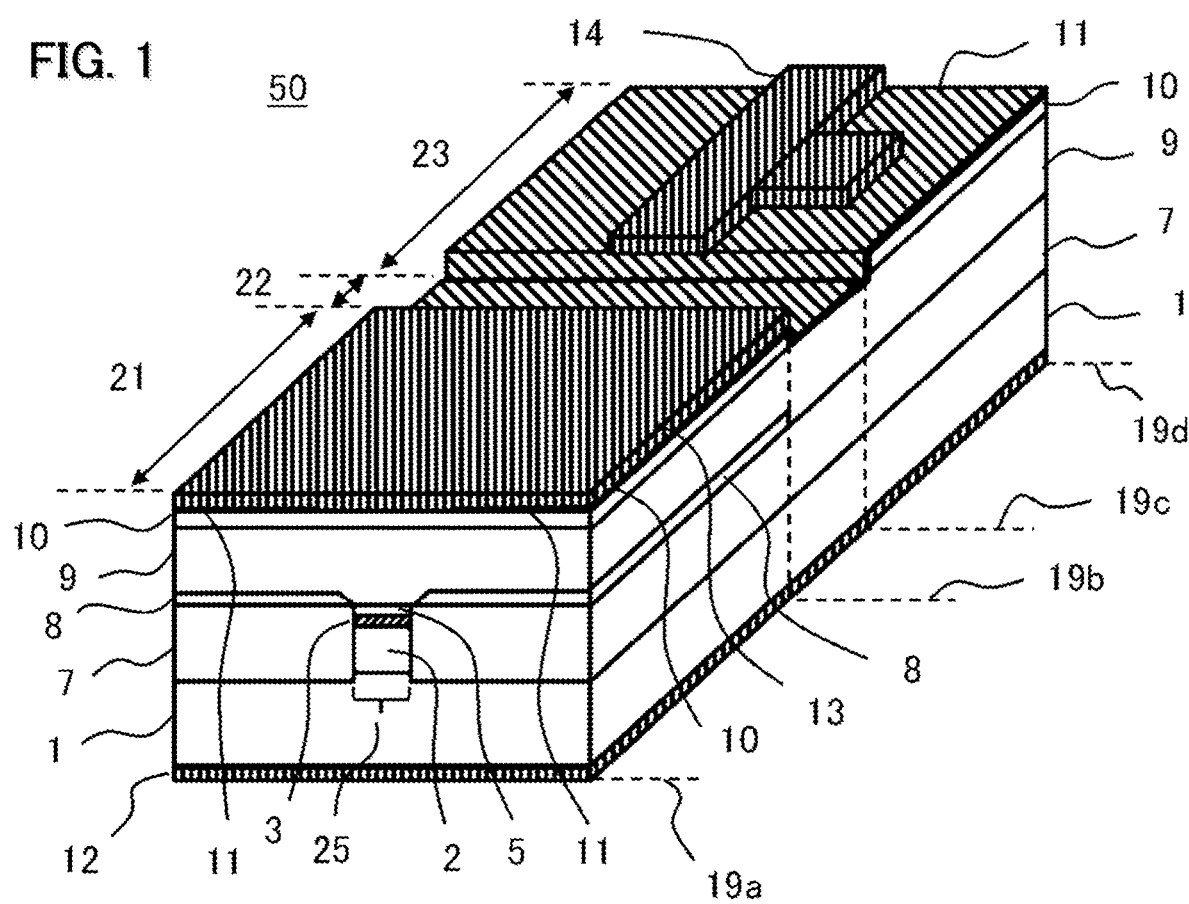
FIG. 1 is a perspective view showing a semiconductor laser device according to Embodiment 1.
Figure 2:
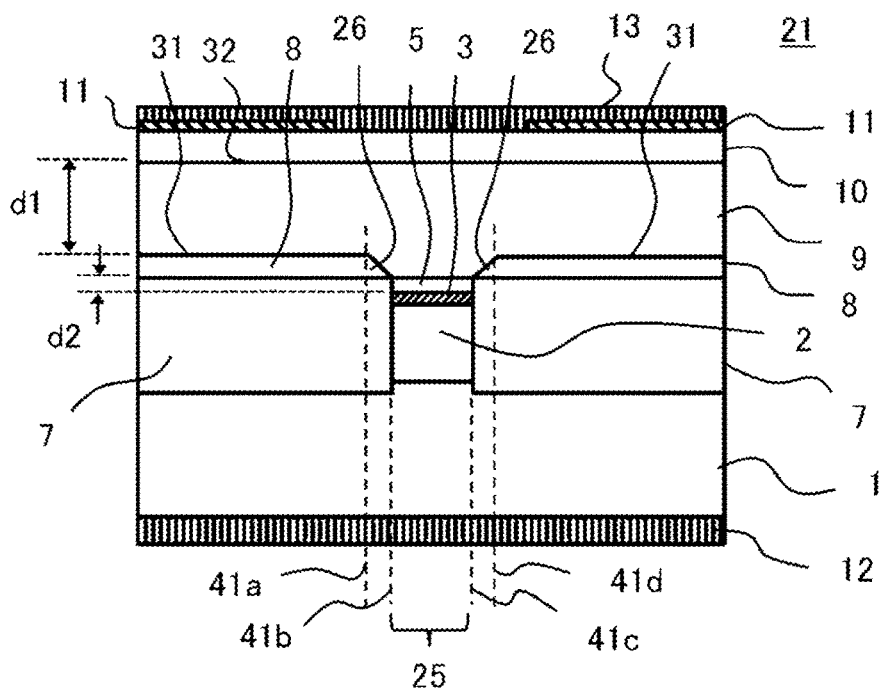
FIG. 2 is a cross-sectional view of a laser section in the semiconductor laser device of FIG. 1.
Figure 3:
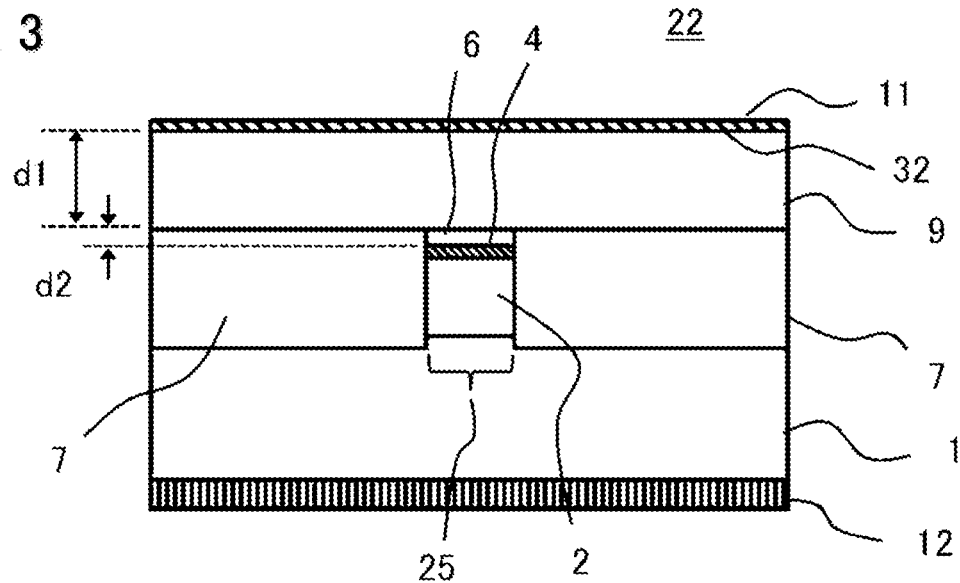
FIG. 3 is a cross-sectional view of a separation section in the semiconductor laser device of FIG. 1.
Figure 4:
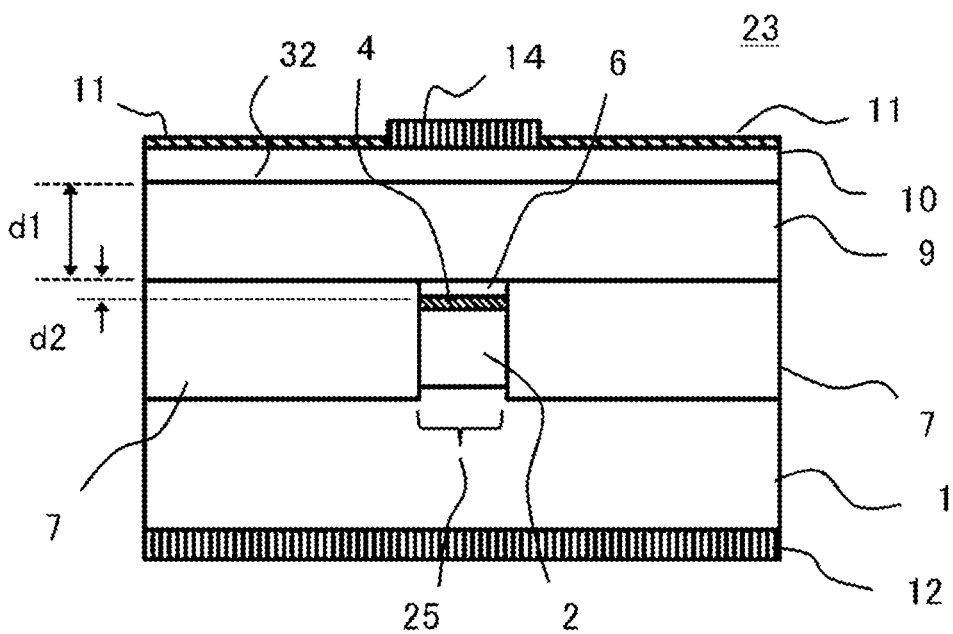
FIG. 4 is a cross-sectional view of a modulator section in the semiconductor laser device of FIG. 1.

FIG. 1 is a perspective view showing a semiconductor laser device according to Embodiment 1. FIG. 2 is a cross-sectional view of a laser section in the semiconductor laser device of FIG. 1; FIG. 3 is a cross-sectional view of a separation section in the semiconductor laser device of FIG. 1; and FIG. 4 is a cross-sectional view of a modulator section in the semiconductor laser device of FIG. 1. A semiconductor laser device 50 according to Embodiment 1 includes a laser section 21, a separation section 22 and a modulator section 23. The modulator section 23 is an electro-absorption (EA) modulator monolithically formed on an n-InP substrate (semiconductor substrate) 1, and thus the semiconductor laser device 50 is an electro-absorption (EA) modulator-integrated semiconductor laser. The laser section 21 is formed in a region between a broken line 19a and a broken line 19b, the separation section 22 is formed in a region between the broken line 19b and a broken line 19c, and the modulator section 23 is formed in a region between the broken line 19c and a broken line 19d.

The laser section 21 is provided with: the n-InP substrate 1; an n-InP cladding layer 2; an active layer 3; a first p-InP cladding layer 5; semi-insulative InP burying layers 7; n-InP burying layers 8; a third p-InP cladding layer 9; a p-InGaAs contact layer 10; an insulative film 11; a cathode electrode 12; and a first anode electrode 13. The modulator section 23 is provided with: the n-InP substrate 1; the n-InP cladding layer 2; an absorption layer 4; a second p-InP cladding layer 6; the semi-insulative InP burying layers 7; the third p-InP cladding layer 9; the p-InGaAs contact layer 10; the insulative film 11; the cathode electrode 12; and a second anode electrode 14. The separation section 22 is a structure serving as a region (separation region, isolation region) for separating the laser section 21 and the modulator section 23 from each other. The separation section 22 is provided with: the n-InP substrate 1; the n-InP cladding layer 2; the absorption layer 4; the second p-InP cladding layer 6; the semi-insulative InP burying layers 7; the third p-InP cladding layer 9; the insulative film 11; and the cathode electrode 12.

The active layer 3 is composed of an InGaAsP multiple-quantum well. The absorption layer 4 is composed of an InGaAsP multiple-quantum well. The semi-insulative InP burying layers 7 are each a semi-insulative InP burying layer doped with Fe (Fe-doped semi-insulative InP burying layer). The Fe-doped semi-insulative InP burying layer is, where appropriate, abbreviated as the Fe—InP burying layer. The insulative film 11 is, for example, an insulative film of $SiO_2$. The semi-insulative InP burying layers 7 are, where appropriate, represented as Fe—InP burying layers 7. In the laser section 21, one of mesa stripes 25, having, for example, a width of 1.5 μm and a layered-direction thickness of 2.5 μm, is formed. The mesa stripe 25 in the laser section 21 is configured with the n-InP cladding layer 2, the active layer 3 and the first p-InP cladding layer 5. The mesa stripes 25 are each a mesa extending in a direction of an optical axis of the laser light to be emitted by the laser section 21. The mesa stripes 25 are continuously formed in the laser section 21, the separation section 22 and the modulator section 23. Although the mesa stripes 25 are continuously formed, the mesa stripes 25 in the laser section 21, the separation section 22 and the modulator section 23, may be stated distinctively as a laser-section mesa stripe, a separation-section mesa stripe and a modulator-section mesa stripe, respectively. The mesa stripe 25 in the laser section 21 is the laser-section mesa stripe (first mesa stripe). The mesa stripe 25 in the separation section 22 is the separation-section mesa stripe (third mesa stripe), and the mesa stripe 25 in the modulator section 23 is the modulator-section mesa stripe (second mesa stripe). In each of the separation section 22 and the modulator section 23, the mesa stripe 25 is formed that is configured with the n-InP cladding layer 2, the absorption layer 4 and the second p-InP cladding layer 6. The mesa stripe 25 in each of the separation section 22 and the modulator section 23 is a mesa stripe having a width of 1.5 μm and a thickness of 2.5 μm that are the same as those in the laser section 21. The width of the mesa stripe 25 is a width in a transverse direction of the semiconductor laser device 50 (lateral direction in FIG. 3), which is a width in a direction perpendicular to the laser-light propagating direction (a direction in which the active layer 3 and the absorption layer 4 extend). The layered-direction thickness of the mesa stripe 25 is a level difference between the back surface of the mesa stripe 25 (its surface on a part of the n-InP substrate 1 and on a planar surface including the back surfaces of the semi-insulative InP burying layers 7) and the front surface thereof (its surface on a side opposite to that facing the n-InP substrate 1), which is a thickness in the vertical direction in FIG. 2 to FIG. 4.

In the laser section 21, on the both sides of the mesa stripe 25, the Fe—InP burying layers 7 each having a thickness of 2.5 μm and the n-InP burying layers 8 to be placed on the surfaces of the Fe—InP burying layers 7 (on their surfaces on a side opposite to that facing the n-InP burying substrate 1), are formed from the n-InP substrate 1-side. The n-InP burying layers 8 each have a thickness of 0.5 μm in regions other than those adjacent to the mesa stripe 25 (in a region outside a broken line 41a (on the left side in FIG. 2) and in a region outside a broken line 41d (on the right side in FIG. 2)), and have a thickness that becomes thinner toward the mesa stripe 25, in the regions adjacent to the mesa stripe 25 (in a region between the broken line 41a and a broken line 41b and in a region between a broken line 41c and the broken line 41d). Portions of the n-InP burying layers 8 in the regions adjacent to the mesa stripe 25 are mesa adjacent portions 26. The thickness of the first p-InP cladding layer 5 stacked on the surface of the active layer 3 is 0.2 μm. On the top (surfaces) of the mesa stripe 25 and the n-InP burying layers 8, the third p-InP cladding layer 9 having a thickness of 2 μm and the p-InGaAs contact layer 10 are successively formed. Further, on the n-InP substrate 1-side, the cathode electrode 12 is formed, while, on the front surface side of the laser section 21, the insulative film 11 in which an opening is created at around a portion located above the mesa stripe 25, and the first anode electrode 13 are formed. The surface of the active layer 3 is formed closer to the n-InP substrate 1 than are the surfaces of the semi-insulative InP burying layers 7.

In the modulator section 23, on the both sides of the mesa stripe 25, the Fe—InP burying layers 7 each having a thickness of 2.5 μm are formed from the n-InP substrate 1-side. The thickness of the second p-InP cladding layer 6 stacked on the surface of the absorption layer 4 is 0.2 μm that is the same as that of the first p-InP cladding layer 5. On the top of the mesa stripe 25 and the Fe—InP burying layers 7, the third p-InP cladding layer 9 and the p-InGaAs contact layer 10 are successively formed. With respect to the third p-InP cladding layer 9, its thickness from the surface of the mesa stripe 25 is 2 μm. Further, on the n-InP substrate 1-side, the cathode electrode 12 is formed, while, on the front surface side of the modulator section 23, the insulative film 11 in which an opening is created at around a portion located above the mesa stripe 25, and the second anode electrode 14 are formed. The surface of the absorption layer 4 is formed closer to the n-InP substrate 1 than are the surfaces of the semi-insulative InP burying layers 7. The length of the modulator section 23 in the longitudinal direction (a direction in which the absorption layer 4 extends) is 200 μm.

The configuration of the separation section 22 differs from the configuration of the modulator section 23 in that the p-InGaAs contact layer 10 and the second anode electrode 14 are absent and no opening is created in the insulative film 11; however, the other parts of these configurations are the same. The surface of the absorption layer 4 is formed closer to the n-InP substrate 1 than are the surfaces of the semi-insulative InP burying layers 7. In FIG. 2, surfaces 31 of the n-InP burying layers 8 and a surface 32 of the third p-InP cladding layer 9 are shown. In FIG. 3 and FIG. 4, the surface 32 of the third p-InP cladding layer 9 is shown.

A manufacturing method of the semiconductor laser device 50 of Embodiment 1 will be described. On the n-InP substrate 1, the n-InP cladding layer 2 and the active layer 3 are crystal-grown by using an MOCVD (Metal organic chemical vapor deposition) method and then, after formation of a diffraction grating (not illustrated) on the surface of the active layer 3, the first p-InP cladding layer 5 is crystal-grown thereon. In the region for the laser section 21, a first mask of $SiO_2$ is formed by patterning, so that portions of the active layer 3 and the first p-InP cladding layer 5 other than those for the laser section 21 are removed by dry etching. Then, on the surface of the n-InP cladding layer 2 for the separation section 22 and the modulator section 23, the absorption layer 4 and the second p-InP cladding layer 6 are crystal-grown. The first mask of $SiO_2$ is removed, so that a multilayer structure for the mesa stripes 25 is formed (multilayer-structure formation step). After the removal of the first mask of $SiO_2$, a second mask of $SiO_2$ is formed over a region where the mesa stripes 25 are to be formed, so that, using dry etching, a portion of the multilayer structure under each of regions outside the second mask is removed, namely, a part of the n-InP substrate 1, and the n-InP cladding layer 2, the active layer 3, the absorption layer 4, the first p-InP cladding layer 5 and the second p-InP cladding layer 6 under that region, are removed, to thereby form the mesa stripes 25 (mesa-stripe formation step).

After the mesa-stripe formation step and in a state where the second mask of $SiO_2$ remains, on the both sides of each of the thus-formed mesa stripes 25, the Fe—InP burying layers 7 and the n-InP burying layers 8 are crystal-grown. In the region for the laser section 21, a third mask of $SiO_2$ is newly formed. Under this condition, dry etching is performed, so that the InP burying layers 8 in the region for the separation section 22 and the modulator section 23 are removed. The two masks of SiO$_2$, that is, the second mask and the third mask, are removed, so that the n-InP burying layers 8 shaped as shown in FIG. 2 are formed. After the removal of the two masks of SiO$_2$, that is, the second mask and the third mask, the third p-InP cladding layer 9 and the p-InGaAs contact layer 10 are formed by crystal growth. A portion of the p-InGaAs contact layer 10 in the region for the separation section 22 is removed, and then, the insulative film 11 of SiO$_2$ is formed on the surface of such an intermediate product of the semiconductor laser device 50 (burying-layer and upper-layer formation step). In the insulative film 11, openings are created at around portions located above the mesa stripe 25 of the laser section 21 and that of the modulator section 23. Thereafter, the first anode electrode 13 and the second anode electrode 14 are formed on a front surface of the semiconductor laser device 50 (its surface on a side opposite to that facing the n-InP substrate 1), and the cathode electrode 12 is formed on the back surface of the n-InP substrate 1 (its surface on a side opposite to that facing the mesa stripe 25) (electrode formation step).

The semiconductor laser device 50 of Embodiment 1 has a structure in which the modulator section 23 and the separation portion 22 have no n-InP burying layer 8. Thus, according to the semiconductor laser device 50 of Embodiment 1, unlike the conventional example shown in Patent Document 2 (conventional example 1), in the modulator section 23 and the separation portion 22, the parasitic capacitance to be induced between the n-InP burying layer 8 and the third p-InP cladding layer 9 is absent, so that the high-frequency characteristic of the modulator section 23 is excellent. Further, according to the semiconductor laser device 50 of Embodiment 1, the thickness of the third p-InP cladding layer 9 formed on the surface of the mesa stripe 25 does not greatly vary throughout the laser section 21, the separation section 22 and the modulator section 23 and thus, unlike the first example of Patent Document 1 (conventional example 2), the loss due to the level difference does not occur.

Meanwhile, in order to prevent light absorption, and disturbance in light-distribution profile, from occurring in the p-InGaAs contact layer 10, the p-InP cladding layers (the first p-InP cladding layer 5 or the second p-InP cladding layer 6, and the third p-InP cladding layer 9) on the top of each of the active layer 3 and the absorption layer 4, are required to have a thickness that is larger than that nearly equal to the size of the light distribution. In the semiconductor laser device 50 of Embodiment 1, the position of the surface 32 of the third p-InP cladding layer 9, distanced from the n-InP substrate 1, is higher than the positions of the surfaces 31 of the n-InP burying layers 8 in the laser section 21, distanced from the n-InP substrate 1. A layered-direction distance d1 from the surfaces 31 of the n-InP burying layers 8 to the surface 32 of the third p-InP cladding layer 9 is 2 µm that is the same as the layer thickness of the third p-InP cladding layer 9 placed on the upper side of the mesa stripe 25. Note that, the shape of the surface 32 of the third p-InP cladding layer 9 is such a shape whose surface portion corresponding to the mesa stripe 25 is recessed (depressed) in conformity with the surface shape of the n-InP burying layers 8 and the mesa stripe 25; however, in FIG. 1 and FIG. 2, it is illustrated simplistically by a planar surface. Also, the p-InGaAs contact layer 10 and the first anode electrode 13 on the top of the third p-InP cladding layer 9 are, like the third p-InP cladding layer 9, illustrated simplistically by using planar surfaces in FIG. 1 and FIG. 2. Further, in accordance with a structure not having the n-InP burying layers 8 in each of the separation section 22 and the modulator section 23, the longitudinal shape of the surface 32 of the third p-InP cladding layer 9 in each of the separation section 22 and the modulator section 23 in which the n-InP burying layers 8 are not formed, is such a shape that is recessed (depressed) relative to the laser section 21; however, in FIG. 1, it is illustrated simplistically by a planar surface. Note that, in the figures for Embodiment 2 and the following Embodiments, the shape of the surface 32 of the third p-InP cladding layer 9 and the shapes of the overlying p-InGaAs contact layer 10 and the like, are also illustrated simplistically each by a planar surface.

According to the semiconductor laser device 50 of Embodiment 1, the layer thickness of the third p-InP cladding layer 9 placed on the upper side of the mesa stripe 25, in each of the laser section 21, the separation section 22 and the modulator section 23, namely, the layered-direction distance d1, is thick as 2 µm, so that light absorption and disturbance in light-distribution profile do not occur in the p-InGaAs contact layer 10. At the same time, according to the semiconductor laser device 50 of Embodiment 1, in the laser section 21, a layered-direction distance d2 from the active layer 3 to the n-InP burying layer 8 is short, so that, unlike the conventional example 2 in which the n-type InP buffer layer corresponding to the n-InP burying layer 8 is located away from the laser active layer, the current blocking effect by the n-InP burying layer 8 is significant. Thus, it is possible to enhance the light-output efficiency relative to the current injected to the laser section 21. As exemplified above, the thickness of each of the first p-InP cladding layer 5 and the second p-InP cladding layer 6 is 0.2 µm, and the thickness of the n-InP burying layer 8 is 0.5 µm. Thus, the layered-direction distance d2 in FIG. 2 to FIG. 4 is 0.2 µm.

The previously-described semiconductor laser device (conventional example 3) as the second example of Patent Document 1 has a structure in which a mesa stripe is formed in the modulator section and the n-type InP buffer layers corresponding to the n-InP burying layers 8 are partially removed. More specifically, the structure is that in which the n-type InP buffer layers are formed at around the surface-perimeter portions of the mesa stripe and on the surfaces outside the surface-perimeter portions, of the Fe-doped InP high-resistance blocking layers corresponding to the semi-insulative InP burying layers 7; and the p-type InP layer corresponding to the third p-InP cladding layer 9 covers the surface-central portion of the mesa stripe and the surfaces of the n-type InP buffer layers. According to the conventional example 3, there is a problem that, when the mesa width is narrowed in order to reduce the parasitic capacitance between the n-type InP buffer layer corresponding to the n-InP burying layer 8 and the p-type InP layer corresponding to the third p-InP cladding layer 9, an optical loss occurs, so that the light-distribution profile is deteriorated. In contrast, the semiconductor laser device 50 of Embodiment 1 has a structure in which the n-InP burying layers 8 are absent in the modulator section 23 and the separation section 22, so that, in the modulator section 23 and the separation section 22, the parasitic capacitance to be induced between the n-InP burying layer 8 and the third p-InP cladding layer 9 is absent. Thus, unlike the conventional example 3, it is unnecessary to decrease the width of the mesa stripe 25 in order to reduce the parasitic capacitance, and thus the optical loss does not occur, so that an excellent light-distribution profile can be achieved.

As described above, the semiconductor laser device 50 of Embodiment 1 is a semiconductor laser device in which the laser section 21 and the modulator section 23 are formed on a same semiconductor substrate (n-InP substrate 1). The laser section 21 has: a first mesa stripe (mesa stripe 25) which is provided as a mesa formed on the semiconductor substrate (n-InP substrate 1) and extending in a direction of an optical axis of the laser light to be emitted by the laser section 21, and which includes the active layer 3; semi-insulative burying layers (semi-insulative InP burying layers 7) which are placed to abut on both side surfaces of the first mesa stripe (mesa stripe 25) and are formed on the semiconductor substrate (n-InP substrate 1); n-type burying layers (n-InP burying layers 8) formed on respective surfaces of the semi-insulative burying layers (semi-insulative InP burying layers 7); and a p-type cladding layer (third p-InP cladding layer 9) which covers surfaces of the n-type burying layers (n-InP burying layers 8) and the first mesa stripe (mesa stripe 25). The modulator section 23 has: a second mesa stripe (mesa stripe 25) which is provided as a mesa formed on the semiconductor substrate (n-InP substrate 1) and extending in the direction of the optical axis, and which includes the absorption layer 4; semi-insulative burying layers (semi-insulative burying layers 7) which are placed to abut on both side surfaces of the second mesa stripe (mesa stripe 25) and are formed on the semiconductor substrate (n-InP substrate 1); and a p-type cladding layer (third p-InP cladding layer 9) which covers surfaces of the semi-insulative burying layers (semi-insulative InP burying layers 7) and the second mesa stripe (mesa stripe 25). According to the semiconductor laser device 50 of Embodiment 1, with such a configuration, because the p-type cladding layer (third p-InP cladding layer 9) in the modulator section 23 covers the surfaces of the semi-insulative burying layers (semi-insulative InP burying layers 7) and the second mesa stripe (mesa stripe 25), the parasitic capacitance due to the n-type burying layer (n-InP burying layer 8) is not produced in the modulator section 23, between the burying layer for burying the mesa stripe 25 which includes the semi-insulative semi-conductor layer (semi-insulative InP burying layer 7), as well as its portion in a region adjacent to the mesa stripe, and the p-type cladding layer (third p-InP cladding layer 9). This allows to make the optical loss small, to thereby enhance the light-output efficiency.

Embodiment 2

Figure 5:
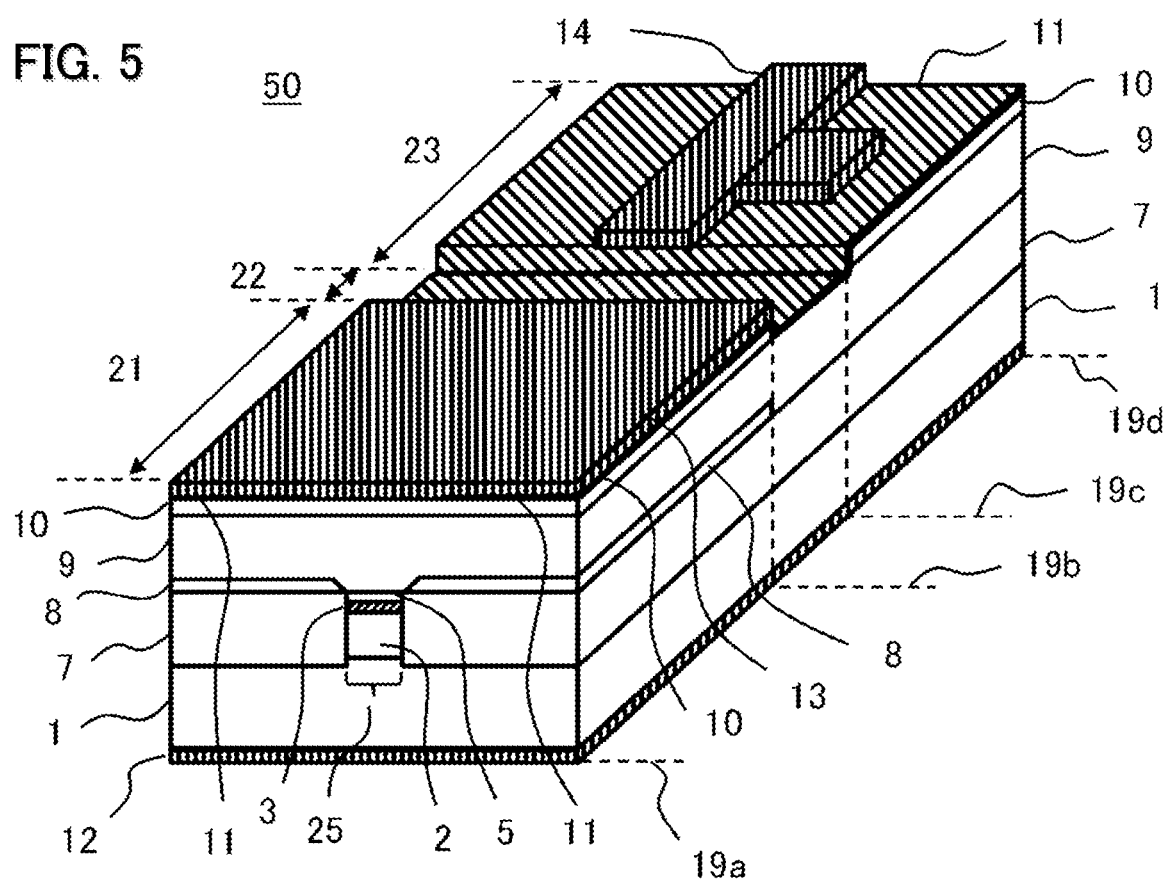
FIG. 5 is a perspective view showing a semiconductor laser device according to Embodiment 2.
Figure 6:
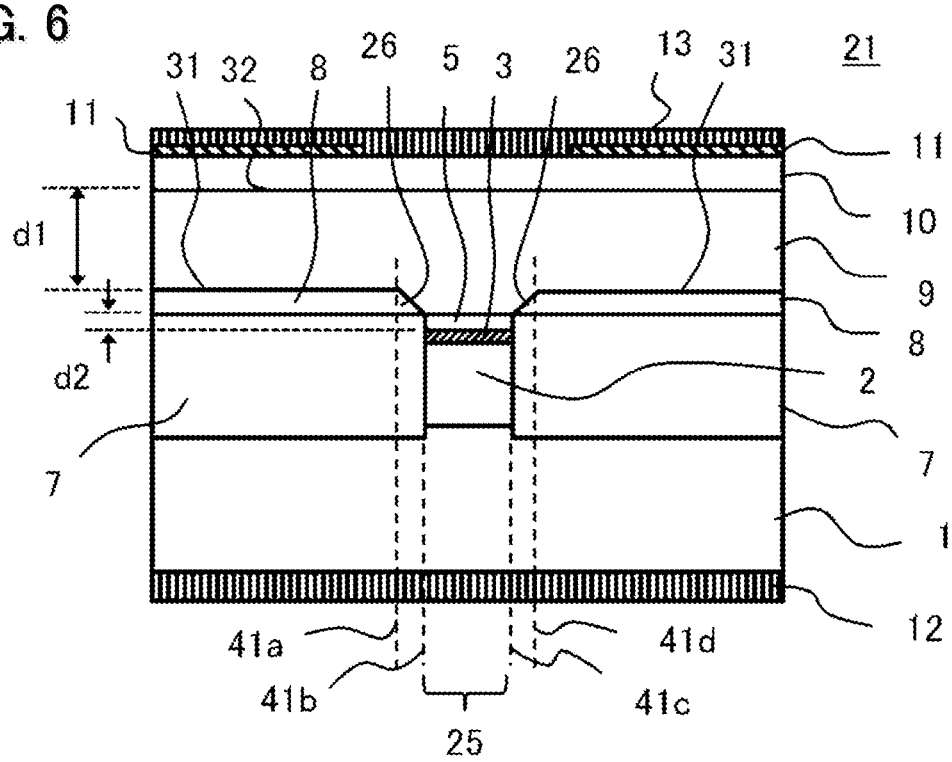
FIG. 6 is a cross-sectional view of a laser section in the semiconductor laser device of FIG. 5.

FIG. 5 is a perspective view showing a semiconductor laser device according to Embodiment 2. FIG. 6 is a cross-sectional view of a laser section in the semiconductor laser device of FIG. 5; FIG. 7 is a cross-sectional view of a separation section in the semiconductor laser device of FIG. 5; and FIG. 8 is a cross-sectional view of a modulator section in the semiconductor laser device of FIG. 5. A semiconductor laser device 50 of Embodiment 2 differs from the semiconductor laser device 50 of Embodiment 1 in that a part of the n-InP burying layer 8 is left in each of regions adjacent to the mesa stripe 25 (a region between a broken line 42a and a broken line 42b, and a region between a broken line 42c and a broken line 42d) in each of the separation section 22 and the modulator section 23. The other configuration is the same as that in the semiconductor laser device 50 of Embodiment 1.

In the regions adjacent to the mesa stripe 25 in each of the separation section 22 and the modulator section 23, the widths (widths in the transverse direction of the semiconductor laser device 50) of the n-InP burying layers 8 being left are each 0.2 µm, for example. The width of the mesa stripe 25 is 1.5 µm, so that, in FIG. 7 and FIG. 8, a case is shown where the width of each of the n-InP burying layers 8 is two-fifteenths of the width of the mesa stripe 25. Further, in FIG. 7 and FIG. 8, a case is shown where the n-InP burying layers 8 each correspond to a partially-left region of the mesa adjacent portion 26 in the n-InP burying layer 8 shown in FIG. 6. In each of the separation section 22 and the modulator section 23, the surfaces of the n-InP burying layers 8 (their surfaces on a side opposite to that facing the n-InP substrate 1) are covered with the third p-InP cladding layer 9.

A manufacturing method of the semiconductor laser device 50 of Embodiment 2 will be described. On the n-InP substrate 1, the n-InP cladding layer 2 and the active layer 3 are crystal-grown by using an MOCVD method and then, after formation of a diffraction grating (not illustrated) on the surface of the active layer 3, the first p-InP cladding layer 5 is crystal-grown thereon. In the region for the laser section 21, a first mask of SiO$_2$ is formed by patterning, so that portions of the active layer 3 and the first p-InP cladding layer 5 other than those for the laser section 21 are removed by dry etching. Then, on the surface of the n-InP cladding layer 2 for the separation section 22 and the modulator section 23, the absorption layer 4 and the second p-InP cladding layer 6 are crystal-grown. The first mask of SiO$_2$ is removed, so that a multilayer structure for the mesa stripes 25 is formed (multilayer-structure formation step). After the removal of the first mask of SiO$_2$, a second mask of SiO$_2$ having a width of 1.5 µm is formed over a region where the mesa stripes 25 are to be formed, so that, using dry etching, a portion of the multilayer structure under each of regions outside the second mask is removed, namely, a part of the n-InP substrate 1, and the n-InP cladding layer 2, the active layer 3, the absorption layer 4, the first p-InP cladding layer 5 and the second p-InP cladding layer 6 under that region, are removed, to thereby form the mesa stripes 25 (mesa-stripe formation step).

After the mesa-stripe formation step and in a state where the second mask of SiO$_2$ remains, on the both sides of each of the thus-formed mesa stripes 25, the Fe—InP burying layers 7 and the n-InP burying layers 8 are crystal-grown. In the region for the laser section 21, a third mask of SiO$_2$ is newly formed. First, after the removal of the second mask of SiO$_2$, silicon oxide is deposited over the entire surface. Note that when the second mask of SiO$_2$ is removed, the n-InP burying layers 8 having shapes shown in FIG. 6 in which the n-InP burying layers 8 become thinner near the mesa stripe 25, are formed. In the region for the laser section 21, the silicon oxide is left on the entire surface, whereas in the region for the separation section 22 and the modulator section 23, the silicon oxide is left in a stripe shape having a width of 1.9 µm centered on the mesa stripe 25, so that the third mask of SiO$_2$ is formed. Thereafter, dry etching is performed, so that portions of the n-InP burying layers 8 in the region for the separation section 22 and the modulator section 23 but not covered with the third mask, are removed. Accordingly, in the laser section 21, the n-InP burying layers 8 are left on the entire surface, while, in the separation section 22 and the modulator section 23, the n-InP burying layers 8 are left just in the regions adjacent to the mesa stripe 25 so as to have a one-side width of 0.2 µm. After the removal of the third mask of SiO$_2$, the third p-InP cladding layer 9 and the p-InGaAs contact layer 10 are formed by crystal growth. After removal of a portion of the p-InGaAs contact layer 10 in the region for the separation section 22, the insulative film 11 of SiO$_2$ is formed on the surface of such an intermediate product of the semiconductor laser device 50 (burying-layer and upper-layer formation step). In that insulative film 11, openings are created at around portions located above the mesa stripe 25 of the laser section 21 and that of the modulator section 23. Thereafter, the first anode electrode 13 and the second anode electrode 14 are formed on a front surface of the semiconductor laser device 50 (its surface on a side opposite to that facing the n-InP substrate 1), and the cathode electrode 12 is formed on the back surface of the n-InP substrate 1 (its surface on a side opposite to that facing the mesa stripe 25) (electrode formation step).

According to the semiconductor laser device 50 of Embodiment 2, in each of the modulator section 23 and the separation section 22, the n-InP burying layers 8 are left in narrow regions with a one-side width of 0.2 µm. Therefore, in comparison with such a structure as represented by the conventional example 1 in which the n-InP burying layers 8 are broadly left, it is possible to drastically reduce the parasitic capacitance to be induced at the interface between the n-InP burying layer 8 and the third p-InP cladding layer 9. Thus, according to the semiconductor laser device 50 of Embodiment 2, an excellent high-frequency characteristic is obtained, so that it is possible to achieve a modulated waveform whose quality is sufficiently well with respect to the modulation at about 10 Gb/s. As described previously, with respect to the second example of Patent Document 1 (conventional example 3), a method is shown in which a mesa stripe is formed in each of the modulator section and the separation section, and the widths of the n-InP burying layers are narrowed. However, according to this method, when, for example, each of the n-InP burying layers whose width is to be determined depending on the width of the mesa stripe, is narrowed so as to have a one-side width of around 0.2 µm, the width of the mesa stripe on which the n-InP burying layer has been removed, becomes narrower in accordance with the width of the n-InP burying layer. According to the method of the conventional example 3, the width of the mesa stripe will be narrower than the light distribution, thus causing an optical loss and a deterioration in the light-distribution profile. In contrast, according to the semiconductor laser device 50 of Embodiment 2, the n-InP burying layers 8 in each of the modulator section 23 and the separation section 22 are sealed with the third p-InP cladding layer 9, thus causing no significant change in refraction index, so that an optical loss and a deterioration in light distribution profile do not occur. Namely, according to the semiconductor laser device 50 of Embodiment 2, in the modulator section 23 and the separation section 22, it is possible to achieve narrowing of the width of the n-InP burying layer 8 for enhancing the high-frequency characteristic, without causing an optical loss and a deterioration in light-distribution profile.

As described above, the semiconductor laser device 50 of Embodiment 2 is a semiconductor laser device in which the laser section 21 and the modulator section 23 are formed on a same semiconductor substrate (n-InP substrate 1). The laser section 21 has: a first mesa stripe (mesa stripe 25) which is provided as a mesa formed on the semiconductor substrate (n-InP substrate 1) and extending in a direction of an optical axis of the laser light to be emitted by the laser section 21, and which includes the active layer 3; semi-insulative burying layers (semi-insulative InP burying layers 7) which are placed to abut on both side surfaces of the first mesa stripe (mesa stripe 25) and are formed on the semi-conductor substrate (n-InP substrate 1); n-type burying layers (n-InP burying layers 8) formed on respective surfaces of the semi-insulative burying layers (semi-insulative InP burying layers 7); and a p-type cladding layer (third p-InP cladding layer 9) which covers surfaces of the n-type burying layers (n-InP burying layers 8) and the first mesa stripe (mesa stripe 25). The modulator section 23 has: a second mesa stripe (mesa stripe 25) which is provided as a mesa formed on the semiconductor substrate (n-InP substrate 1) and extending in the direction of the optical axis, and which includes the absorption layer 4; semi-insulative burying layers (semi-insulative burying layers 7) which are placed to abut on both side surfaces of the second mesa stripe (mesa stripe 25) and are formed on the semiconductor substrate (n-InP substrate 1); n-type burying layers (n-InP burying layers 8) which are formed on respective surfaces of the semi-insulative burying layers (semi-insulative InP burying layers 7) but are placed in regions thereon adjacent to the second mesa stripe (mesa stripe 25); and a p-type cladding layer (third p-InP cladding layer 9) which covers surfaces of the semi-insulative burying layers (semi-insulative InP burying layers 7), the n-type burying layers (n-InP burying layers 8) and the second mesa stripe (mesa stripe 25). According to the semiconductor laser device 50 of Embodiment 2, with such a configuration, because the p-type cladding layer (third p-InP cladding layer 9) in the modulator section 23 covers the surfaces of the semi-insulative burying layers (semi-insulative InP burying layers 7), the n-type burying layers (n-InP burying layers 8) and the second mesa stripe (mesa stripe 25), it is possible in the modulator section 23, to make the parasitic capacitance due to the n-type burying layer (n-InP burying layer 8) to be produced between the burying layer for burying the mesa stripe 25 which includes the semi-insulative semiconductor layer (semi-insulative InP burying layer 7) and the p-type cladding layer (third p-InP cladding layer 9), smaller than that in the conventional case. This allows to make the optical loss small, to thereby enhance the light-output efficiency.

Embodiment 3

Figure 9:
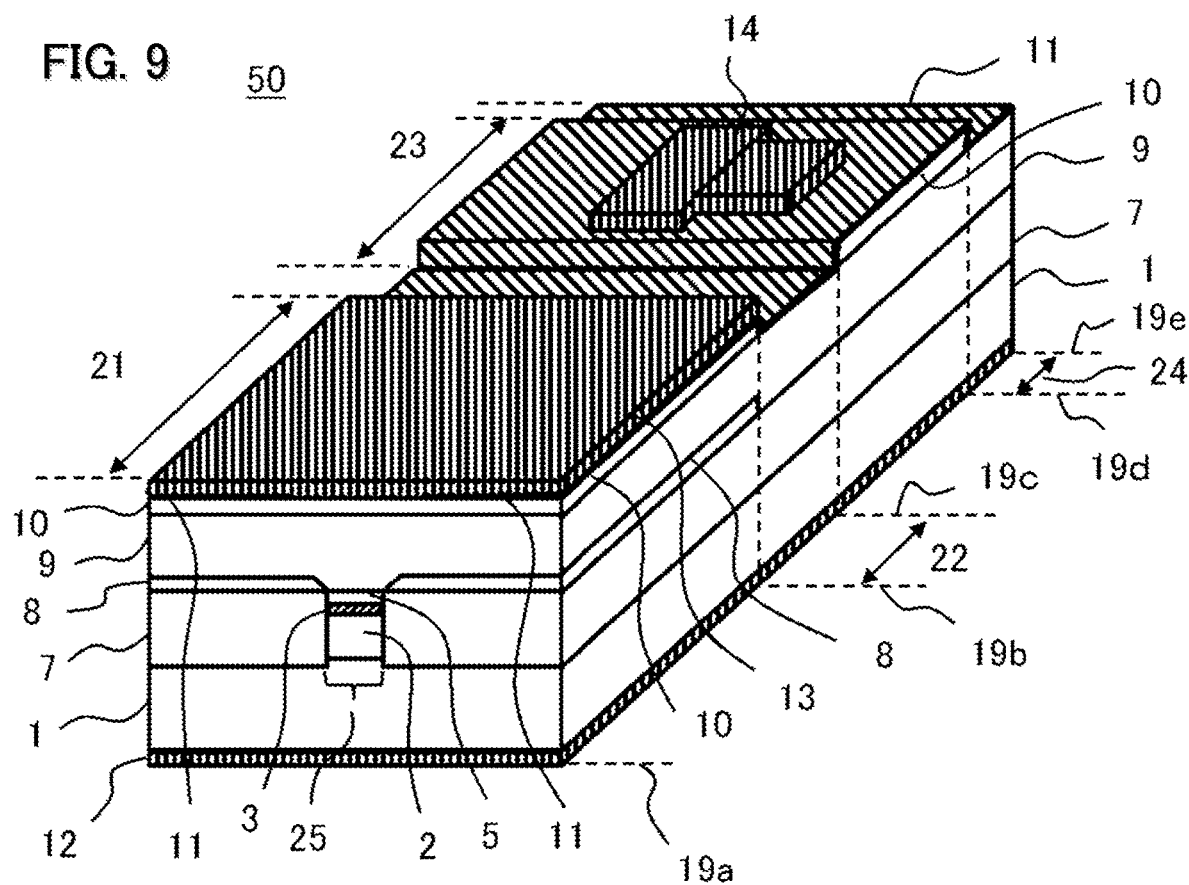
FIG. 9 is a perspective view showing a semiconductor laser device according to Embodiment 3.
Figure 10:
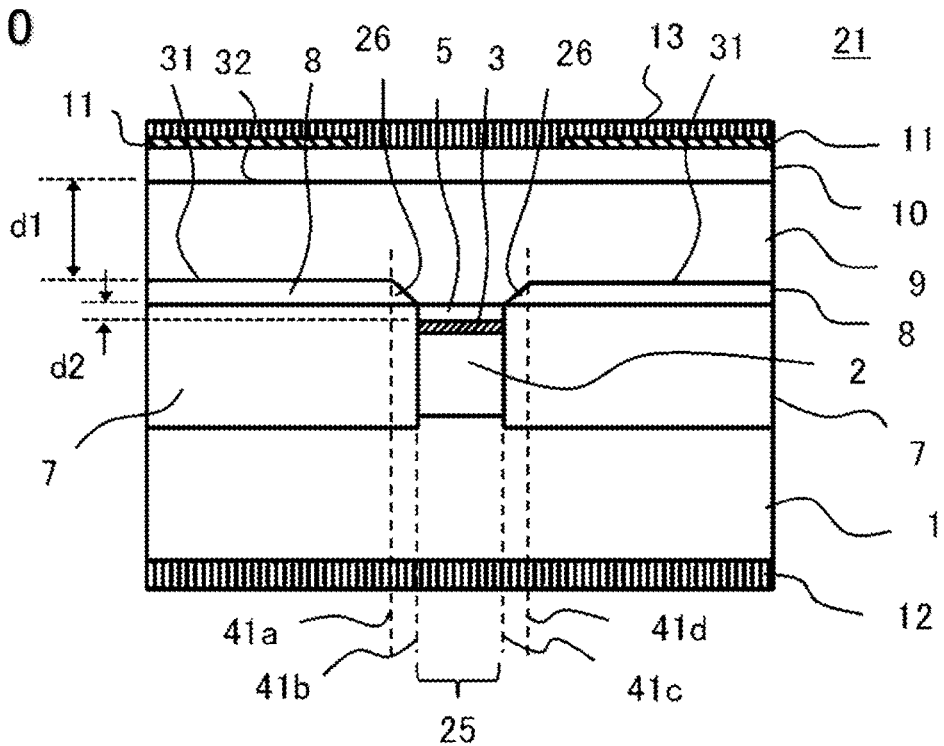
FIG. 10 is a cross-sectional view of a laser section in the semiconductor laser device of FIG. 9.
Figure 11:
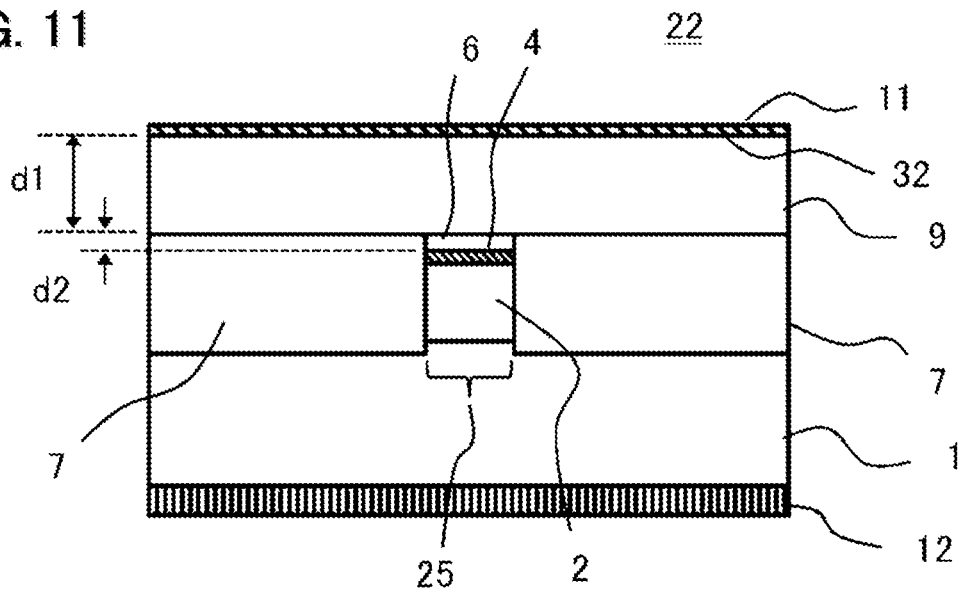
FIG. 11 is a cross-sectional view of a separation section in the semiconductor laser device of FIG. 9.
Figure 12:
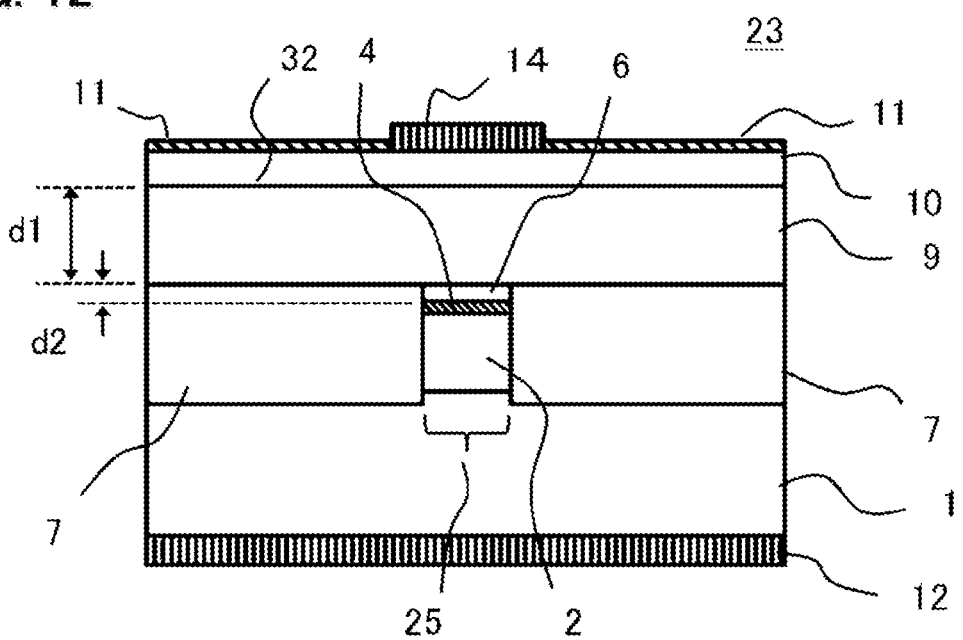
FIG. 12 is a cross-sectional view of a modulator section in the semiconductor laser device of FIG. 9.
Figure 13:
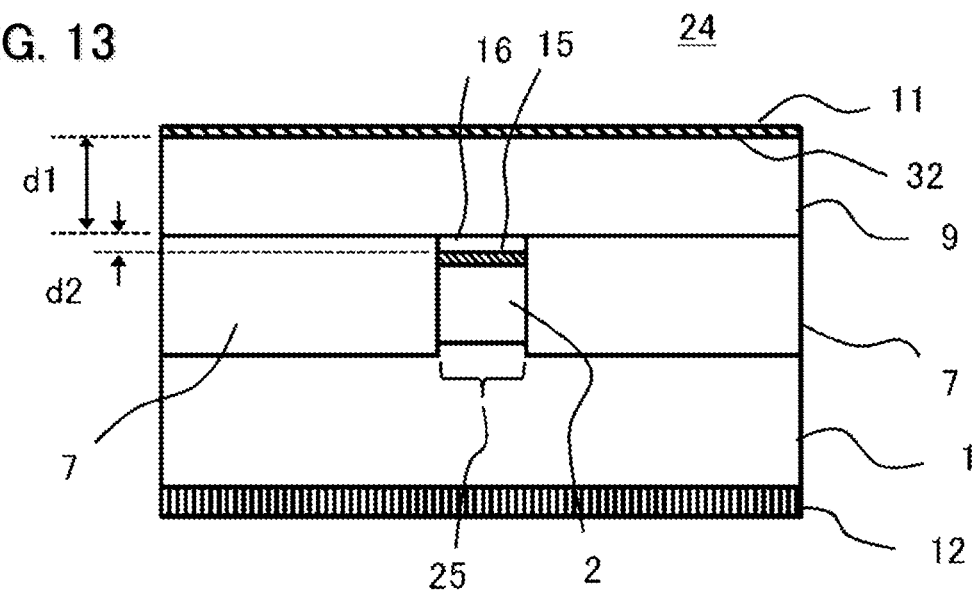
FIG. 13 is a cross-sectional view of a spot-size converter section in the semiconductor laser device of FIG. 9.

FIG. 9 is a perspective view showing a semiconductor laser device according to Embodiment 3. FIG. 10 is a cross-sectional view of a laser section in the semiconductor laser device of FIG. 9, and FIG. 11 is a cross-sectional view of a separation section in the semiconductor laser device of FIG. 9. FIG. 12 is a cross-sectional view of a modulator section in the semiconductor laser device of FIG. 9, and FIG. 13 is a cross-sectional view of a spot-size converter section in the semiconductor laser device of FIG. 9. A semiconductor laser device 50 of Embodiment 3 differs from the semiconductor laser device 50 of either Embodiment 1 or Embodiment 2, in being provided with a spot-size converter section 24 on the downstream side of the modulator section 23 with respect to the propagation direction of the laser light. The spot-size converter 24 is formed in a region between a broken line 19d and a broken line 19e. The other configuration is the same as that in the semiconductor laser device 50 of either Embodiment 1 or Embodiment 2. In FIG. 11 and FIG. 12, a case is shown where the respective structures of the separation section 22 and the modulator section 23 are the same as those in Embodiment 1. Note that a case about another semiconductor laser device according to Embodiment 3 in which the separation section 22 and the modulator section 23 have the same structures as those in Embodiment 2, will be described later. The spot-size converter section will be, where appropriate, represented abbreviately as "SSC section".

In the SSC section 24, one of mesa stripes 25 is formed which is configured with a part of the n-InP substrate 1, an n-InP cladding layer 2, an InGaAsP waveguide layer 15 and a fourth p-InP cladding layer 16, and has a thickness of 2.5 µm. The mesa stripes 25 are continuously formed in the laser section 21, the separation section 22, the modulator section 23 and the spot-size converter section 24. Although the mesa stripes 25 are continuously formed, the mesa stripes 25 in the laser section 21, the separation section 22, the modulator section 23 and the spot-size converter section 24 may be stated distinctively as a laser-section mesa stripe (first mesa stripe), a separation-section mesa stripe (third mesa stripe), a modulator-section mesa stripe (second mesa stripe) and a spot-size converter-section mesa stripe (SSC-section mesa stripe), respectively. The mesa stripe 25 in the spot-size converter section 24 is the spot-size converter-section mesa stripe (SSC-section mesa stripe (fourth mesa stripe)). In the SSC section 24, on the both sides of the mesa stripe 25, Fe—InP burying layers 7 each having a thickness of 2.5 µm are formed. The thickness of the fourth p-InP cladding layer 16 is 0.2 µm. On the top (surfaces) of the mesa stripe 25 and the Fe—InP burying layers 7, a third p-InP cladding layer 9 is formed. The thickness of the third p-InP cladding layer 9 from the surface of the mesa stripe 25 is 2 µm. Further, on a surface 32 of the third p-InP cladding layer 9, an insulative film 11 of SiO$_2$ is formed. The length of the SCC section 24 in the longitudinal direction (a direction in which the waveguide layer 15 extends) is 100 µm. Further, the width of the mesa stripe 25 in the SSC section 24 is 1.5 µm at the interface with the modulator section 23; however, the width of the mesa stripe 25 is set so that it becomes narrower to be tapered as the position becomes closer to the end face-side of the SCC section 24 in the longitudinal direction (a propagation direction of the laser light), and thus the width at the end face (end face indicated by the broken line 19e) of the semiconductor laser device 50 is 0.5 µm. The surface of the waveguide layer 15 is formed closer to the n-InP substrate 1 than are the surfaces of the semi-insulative InP burying layers 7.

Description will be made about the mesa stripes 25 in the semiconductor laser device 50 of Embodiment 3. With respect to the mesa stripes 25 in the laser section 21, the separation section 22 and the modulator section 23, namely, the mesa stripes 25 from the broken line 19a to the broken line 19d, the thickness is 2.5 µm and the width is 1.5 µm. With respect to the mesa stripe 25 in the SSC section 24, namely, the mesa stripe 25 from the broken line 19d to the broken line 19e, the thickness is 2.5 µm but the width varies from 1.5 µm to 0.5 µm. The mesa stripe 25 in the SSC section 24 has a tapered surface shape. The thicknesses of the n-InP cladding layers 2 in the laser section 21, the separation section 22, the modulator section 23 and the SSC section 24, are the same. The thicknesses of the first p-InP cladding layer 5 in the laser section 21, the second p-InP cladding layer 6 in each of the separation section 22 and the modulator section 23, and the fourth p-InP cladding layer 16 in the SSC section 24, are each 0.2 µm. The thicknesses of the active layer 3 in the laser section 21, the absorption layer 4 in each of the separation section 22 and the modulator section 23, and the waveguide layer 15 in the SSC section 24, are the same.

The semiconductor laser device 50 of Embodiment 3 includes the SSC section 24 in which the waveguide layer 15 becomes narrower to be tapered relative to the optical axis (an axis in the propagation direction) of the laser light and thus, with respect to the laser light of the laser section 21 (emitted light), it is possible to enlarge the spot size of a near-field pattern (NFP) and to narrow the beam spread angle of a far-field pattern (FFP). This allows to use a low-magnification lens in an optical module product or an optical transceiver product in which the semiconductor laser device 50 of Embodiment 3 is employed. The semiconductor laser device 50 of Embodiment 3 shown in FIG. 9 to FIG. 13 is provided with the laser section 21, the separation section 22 and the modulator section 23 whose structures are the same as those in the semiconductor laser device 50 of Embodiment 1 and thus, accomplishes the same effects as those by the semiconductor laser device 50 of Embodiment 1.

Figure 14:
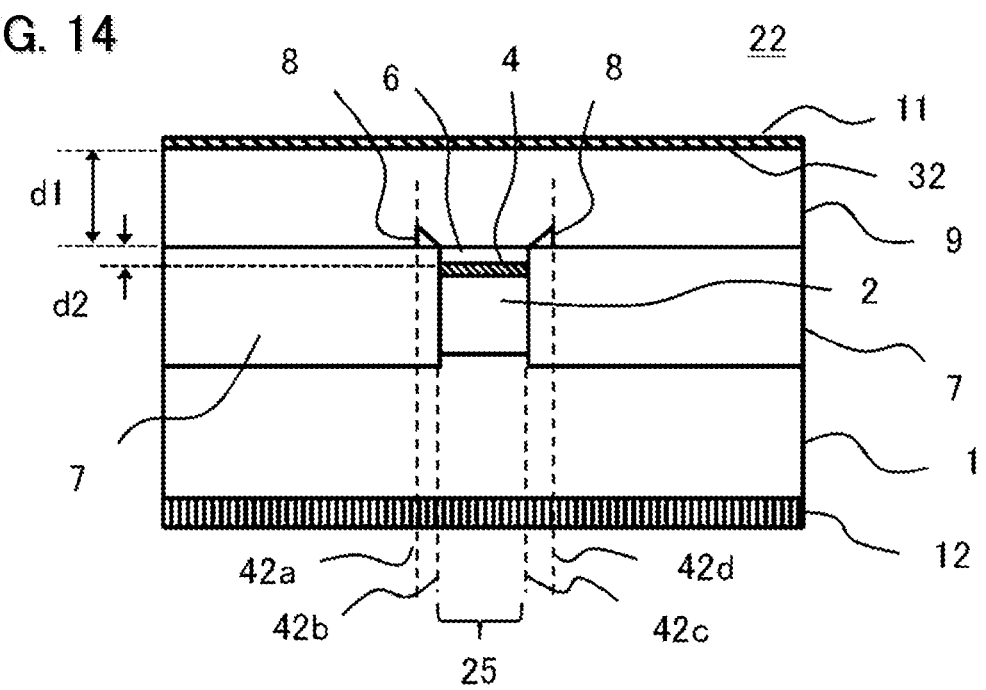
FIG. 14 is a cross-sectional view of another separation section in the semiconductor laser device of FIG. 9.
Figure 15:
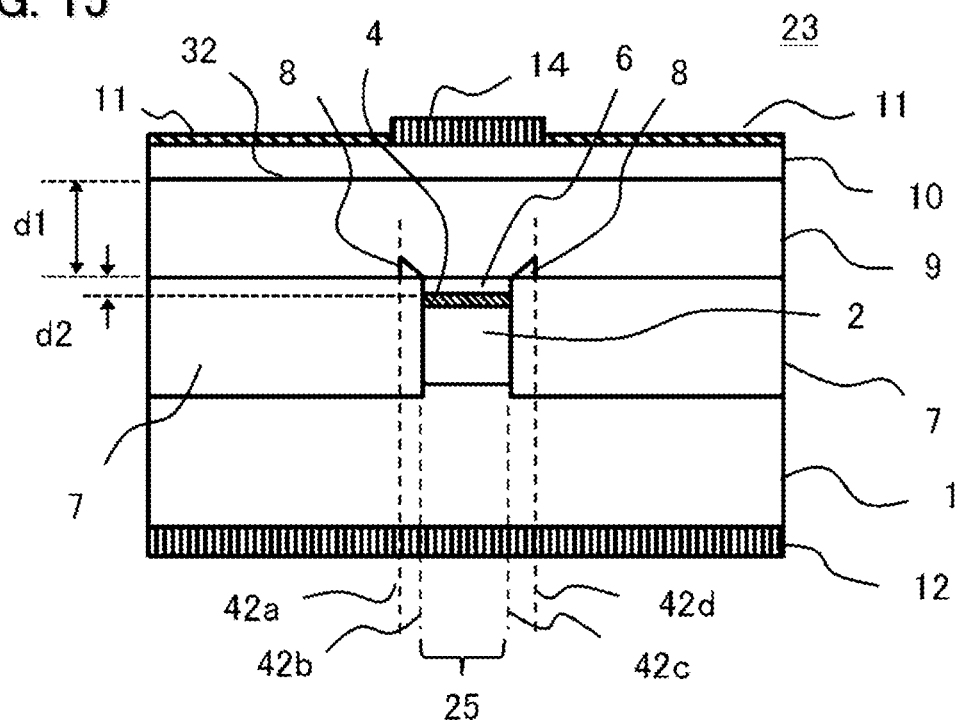
FIG. 15 is a cross-sectional view of another modulator section in the semiconductor laser device of FIG. 9.
Figure 16:
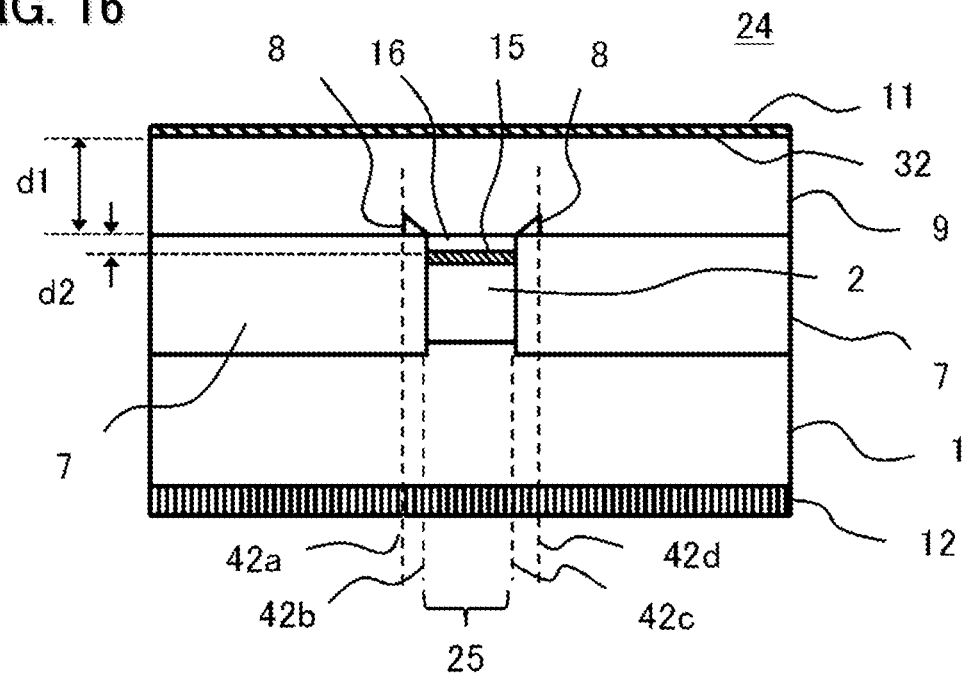
FIG. 16 is a cross-sectional view of another spot-size converter section in the semiconductor laser device of FIG. 9.

As mentioned previously, description will be made about another semiconductor laser device according to Embodiment 3 in which the separation section 22 and the modulator section 23 have the same structures as those in Embodiment 2. A perspective view of the other semiconductor laser device 50 according to Embodiment 3 and a cross-sectional view of a laser section 21 therein, are the same as FIG. 9 and FIG. 10, respectively. FIG. 14 is a cross-sectional view of another separation section in the semiconductor laser device of FIG. 9; FIG. 15 is a cross-sectional view of another modulator section in the semiconductor laser device of FIG. 9; and FIG. 16 is a cross-sectional view of another spot-size converter section in the semiconductor laser device of FIG. 9. The structures of the laser section 21, the separation section 22 and the modulator section 23 in the other semiconductor laser device 50 according to Embodiment 3, are the same as those in Embodiment 2.

In the other semiconductor laser device 50 according to Embodiment 3, the spot-size converter section 24 shown in FIG. 16 differs from the spot-size converter section 24 shown in FIG. 13 in that a part of the n-InP burying layer 8 is left in each of regions adjacent to the mesa stripe 25 (a region between a broken line 42a and a broken line 42b, and a region between a broken line 42c and a broken line 42d). In the regions adjacent to the mesa stripe 25 in each of the separation section 22, the modulator section 23 and the spot-size converter section 24, the widths (widths in the transverse direction of the semiconductor laser device 50) of the n-InP burying layers 8 being left are each 0.2 µm, for example. The mesa stripe 25 in the spot-size converter section 24 has a tapered surface shape in which the width varies from 1.5 µm to 0.5 µm. In the spot-size converter section 24, like in the separation section 22 and the modulator section 23, the surfaces of the n-InP burying layers 8 (their surfaces on a side opposite to that facing the n-InP substrate 1) are covered with the third p-InP cladding layer 9.

The other semiconductor laser device 50 of Embodiment 3 includes the SSC section 24 in which the waveguide layer 15 becomes narrower to be tapered relative to the optical axis (an axis in the propagation direction) of the laser light, so that, with respect to the laser light of the laser section 21 (emitted light), it is possible to enlarge the spot size of a near-field pattern (NFP) and to narrow the beam spread angle of a far-field pattern (FFP). This allows to use a low-magnification lens in an optical module product or an optical transceiver product in which the other semiconductor laser device 50 of Embodiment 3 is employed. Note that, with respect to the waveguide layer 15 in the spot-size converter section 24, a case has been shown where the width becomes narrower to be tapered relative to the optical axis (an axis in the propagation direction) of the laser light. However, with respect to the waveguide layer 15 in the spot-size converter section 24, the layer thickness may become thinner to be tapered relative to the optical axis (an axis in the propagation direction) of the laser light. When this is the case, according to the other semiconductor laser device 50 of Embodiment 3, it is also possible, with respect to the laser light of the laser section 21 (emitted light), to enlarge the spot size of a near-field pattern (NFP) and to narrow the beam spread angle of a far-field pattern (FFP). The other semiconductor laser device 50 of Embodiment 3 shown in FIG. 9, FIG. 10 and FIG. 14 to FIG. 16 is provided with the laser section 21, the separation section 22 and the modulator section 23 whose structures are the same as those in the semiconductor laser device 50 of Embodiment 2 and thus, accomplishes the same effects as those by the semiconductor laser device 50 of Embodiment 2.

Embodiment 4

Figure 17:
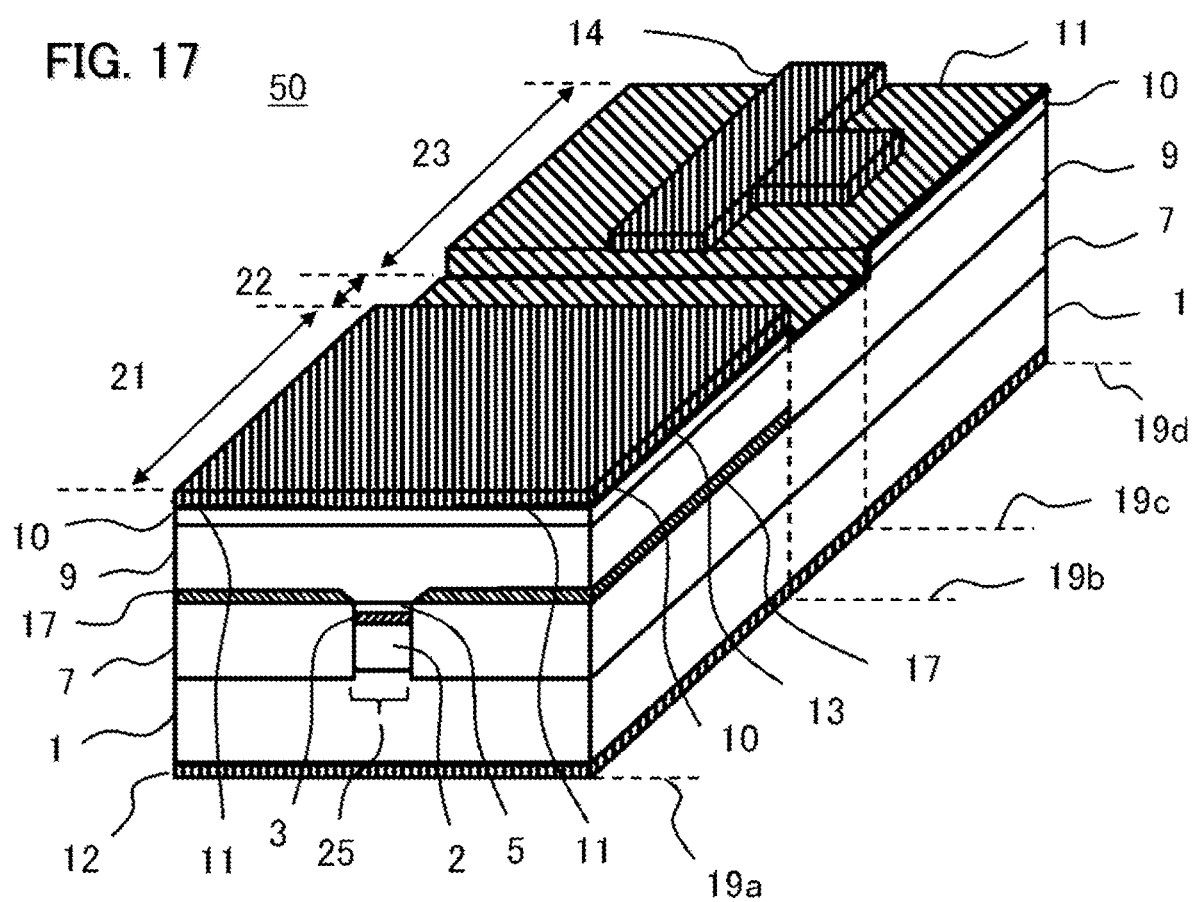
FIG. 17 is a perspective view showing a semiconductor laser device according to Embodiment 4.
Figure 18:
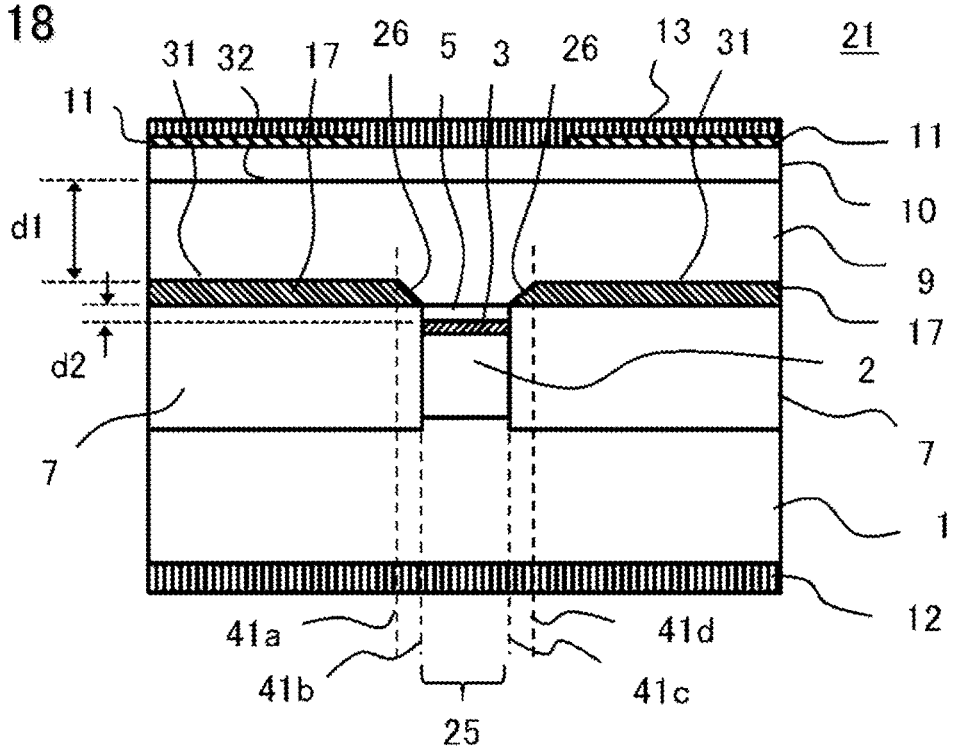
FIG. 18 is a cross-sectional view of a laser section in the semiconductor laser device of FIG. 17.

FIG. 17 is a perspective view showing a semiconductor laser device according to Embodiment 4, and FIG. 18 is a cross-sectional view of a laser section in the semiconductor laser device of FIG. 17. A semiconductor laser device 50 of Embodiment 4 differs from the semiconductor laser devices 50 of Embodiments 1 and 2 in that the n-type burying layers in the laser section 21 are n-AlInAs burying layers 17. The other configuration is the same as that in the semiconductor laser device 50 of either Embodiment 1 or Embodiment 2.

According to the semiconductor laser device 50 of Embodiment 4, since the n-AlInAs burying layers 17 are used in the laser section 21, the current blocking effect is enhanced in the laser section 21. The semiconductor laser device 50 of Embodiment 4 is provided with the laser section 21, the separation section 22 and the modulator section 23 whose structures are the same as those in the semiconductor laser device 50 of Embodiment 1 or Embodiment 2 and thus, accomplishes the same effects as those by the semiconductor laser device 50 of Embodiment 1 or Embodiment 2.

It is noted that, with respect also to the semiconductor laser device 50 of Embodiment 3, replacing the n-InP burying layers 8 with the n-AlInAs burying layers 17 in the laser section 21, makes it possible to enhance the current blocking effect in the laser section 21.

In this application, a variety of exemplary embodiments and examples are described; however, every characteristic, configuration or function that is described in one or more embodiments, is not limited to being applied to a specific embodiment, and may be applied singularly or in any of various combinations thereof to another embodiment. Accordingly, an infinite number of modified examples that are not exemplified here are supposed within the technical scope disclosed in the present description. For example, such cases shall be included where at least one configuration element is modified; where any configuration element is added or omitted; and furthermore, where at least one configuration element is extracted and combined with a configuration element of another embodiment.

DESCRIPTION OF REFERENCE NUMERALS AND SIGNS

1: n-InP substrate (semiconductor substrate), 2: n-InP cladding layer (n-type cladding layer), 3: active layer, 4: absorption layer, 5: first p-InP cladding layer (p-type cladding layer), 6: second p-InP cladding layer (p-type cladding layer), 7: semi-insulative InP burying layer (semi-insulative burying layer), 8: n-InP burying layer (n-type burying layer), 9: third p-InP cladding layer (p-type cladding layer), 15: waveguide layer, 16: fourth p-InP cladding layer (p-type cladding layer), 17: n-AlInAs burying layer (n-type burying layer), 21: laser section, 22: separation section, 23: modulator section, 24: spot-size converter section, 25: mesa stripe (first mesa stripe, second mesa stripe, third mesa stripe, fourth mesa stripe), 50: semiconductor laser device.

The invention claimed is:

1. A semiconductor laser device, comprising a laser section and a modulator section which are formed on a same semiconductor substrate;
   wherein the laser section has: a first mesa stripe which is provided as a mesa formed on the semiconductor substrate and extending in a direction of an optical axis of laser light to be emitted by the laser section, and which includes an active layer; semi-insulative burying layers which are placed to abut on both side surfaces of the first mesa stripe and are formed on the semiconductor substrate; n-type burying layers formed on respective surfaces of the semi-insulative burying layers; and a p-type cladding layer which covers surfaces of the n-type burying layers and the first mesa stripe;
   wherein the modulator section has: a second mesa stripe which is provided as a mesa formed on the semiconductor substrate and extending in the direction of the optical axis, and which includes an absorption layer; semi-insulative burying layers which are placed to abut on both side surfaces of the second mesa stripe and are formed on the semiconductor substrate; and a p-type cladding layer which covers surfaces of the semi-insulative burying layers and the second mesa stripe; and
   wherein the separation section has: a third mesa stripe which is provided as a mesa formed on the semiconductor substrate and extending in the direction of the optical axis, and which includes an absorption layer; semi-insulative burying layers which are placed to abut on both side surfaces of the third mesa stripe and are formed on the semiconductor substrate; n-type burying layers which are formed on respective surfaces of the semi-insulative burying layers but are placed only in regions thereon adjacent to the third mesa stripe; and a p-type cladding layer which covers surfaces of the semi-insulative burying layers, the n-type burying layers and the third mesa stripe.

2. The semiconductor laser device of claim 1, wherein the first mesa stripe in the laser section has an n-type cladding layer, the active layer and a p-type cladding layer successively stacked on the semiconductor substrate, and a surface of the active layer is formed closer to the semiconductor substrate than are the surfaces of the semi-insulative burying layers.

3. The semiconductor laser device of claim 2, wherein the third mesa stripe in the separation section has an n-type cladding layer, the absorption layer and a p-type cladding layer successively stacked on the semiconductor substrate, and a surface of the absorption layer is formed closer to the semiconductor substrate than are the surfaces of the semi-insulative burying layers.

4. The semiconductor laser device of claim 1, further comprising, on a side of the modulator section opposite to that facing the laser section, a spot-size converter section in which a width or a layer thickness of a waveguide layer varies along the optical axis of the laser light;
   wherein the spot-size converter section has: a fourth mesa stripe which is provided as a mesa formed on the semiconductor substrate and extending in the direction of the optical axis, and which includes said waveguide layer; semi-insulative burying layers which are placed to abut on both side surfaces of the fourth mesa stripe and are formed on the semiconductor substrate; and a p-type cladding layer which covers surfaces of the semi-insulative burying layers and the fourth mesa stripe.

5. The semiconductor laser device of claim 1, further comprising, on a side of the modulator section opposite to that facing the laser section, a spot-size converter section in which a width or a layer thickness of a waveguide layer varies along the optical axis of the laser light;
wherein the spot-size converter section has: a fourth mesa stripe which is provided as a mesa formed on the semiconductor substrate and extending in the direction of the optical axis, and which includes said waveguide layer; semi-insulative burying layers which are placed to abut on both side surfaces of the fourth mesa stripe and are formed on the semiconductor substrate; n-type burying layers which are formed on respective surfaces of the semi-insulative burying layers but are placed only in regions thereon adjacent to the fourth mesa stripe; and a p-type cladding layer which covers surfaces of the semi-insulative burying layers, the n-type burying layers and the fourth mesa stripe.

6. The semiconductor laser device of claim 1, wherein the n-type burying layers in the laser section are n-type InP burying layers.

7. The semiconductor laser device of claim 1, wherein the n-type burying layers in the laser section are n-type AlInAs burying layers.

8. A semiconductor laser device, comprising a laser section and a modulator section which are formed on a same semiconductor substrate;
wherein the laser section has: a first mesa stripe which is provided as a mesa formed on the semiconductor substrate and extending in a direction of an optical axis laser light to be emitted by the laser section, and which includes an active layer; semi-insulative burying layers which are placed to abut on both side surfaces of the first mesa stripe and are formed on the semiconductor substrate; n-type burying layers formed on respective surfaces of the semi-insulative burying layers; and a p-type cladding layer which covers surfaces of the n-type burying layers and the first mesa stripe; and
wherein the modulator section has: a second mesa stripe which is provided as a mesa formed on the semiconductor substrate and extending in the direction of the optical axis, and which includes an absorption layer; semi-insulative burying layers which are placed to abut on both side surfaces of the second mesa stripe and are formed on the semiconductor substrate; n-type burying layers which are formed on respective surfaces of the semi-insulative burying layers but are placed only in regions thereon adjacent to the second mesa stripe; and a p-type cladding layer which covers surfaces of the semi-insulative burying layers, the n-type burying layers and the second mesa stripe.

9. The semiconductor laser device of claim 8, further comprising a separation section formed between the laser section and the modulator section;
wherein the separation section has: a third mesa stripe which is provided as a mesa formed on the semiconductor substrate and extending in the direction of the optical axis, and which includes an absorption layer; semi-insulative burying layers which are placed to abut on both side surfaces of the third mesa stripe and are formed on the semiconductor substrate; and a p-type cladding layer which covers surfaces of the semi-insulative burying layers and the third mesa stripe.

10. The semiconductor laser device of claim 9, wherein the first mesa stripe in the laser section has an n-type cladding layer, the active layer and a p-type cladding layer successively stacked on the semiconductor substrate, and a surface of the active layer is formed closer to the semiconductor substrate than are the surfaces of the semi-insulative burying layers.

11. The semiconductor laser device of claim 9, further comprising, on a side of the modulator section opposite to that facing the laser section, a spot-size converter section in which a width or a layer thickness of a waveguide layer varies along the optical axis of the laser light;
wherein the spot-size converter section has: a fourth mesa stripe which is provided as a mesa formed on the semiconductor substrate and extending in the direction of the optical axis, and which includes said waveguide layer; semi-insulative burying layers which are placed to abut on both side surfaces of the fourth mesa stripe and are formed on the semiconductor substrate; and a p-type cladding layer which covers surfaces of the semi-insulative burying layers and the fourth mesa stripe.

12. The semiconductor laser device of claim 9, further comprising, on a side of the modulator section opposite to that facing the laser section, a spot-size converter section in which a width or a layer thickness of a waveguide layer varies along the optical axis of the laser light;
wherein the spot-size converter section has: a fourth mesa stripe which is provided as a mesa formed on the semiconductor substrate and extending in the direction of the optical axis, and which includes said waveguide layer; semi-insulative burying layers which are placed to abut on both side surfaces of the fourth mesa stripe and are formed on the semiconductor substrate; n-type burying layers which are formed on respective surfaces of the semi-insulative burying layers but are placed only in regions thereon adjacent to the fourth mesa stripe; and a p-type cladding layer which covers surfaces of the semi-insulative burying layers, the n-type burying layers and the fourth mesa stripe.

13. The semiconductor laser device of claim 9, wherein the n-type burying layers in the laser section are n-type InP burying layers.

14. The semiconductor laser device of claim 8, further comprising a separation section formed between the laser section and the modulator section;
wherein the separation section has: a third mesa stripe which is provided as a mesa formed on the semiconductor substrate and extending in the direction of the optical axis, and which includes an absorption layer; semi-insulative burying layers which are placed to abut on both side surfaces of the third mesa stripe and are formed on the semiconductor substrate; n-type burying layers which are formed on respective surfaces of the semi-insulative burying layers but are placed only in regions thereon adjacent to the third mesa stripe; and a p-type cladding layer which covers surfaces of the semi-insulative burying layers, the n-type burying layers and the third mesa stripe.

15. The semiconductor laser device of claim 14, wherein the first mesa stripe in the laser section has an n-type cladding layer, the active layer and a p-type cladding layer successively stacked on the semiconductor substrate, and a surface of the active layer is formed closer to the semiconductor substrate than are the surfaces of the semi-insulative burying layers.

16. The semiconductor laser device of claim 8, wherein the first mesa stripe in the laser section has an n-type cladding layer, the active layer and a p-type cladding layer successively stacked on the semiconductor substrate, and a surface of the active layer is formed closer to the semiconductor substrate than are the surfaces of the semi-insulative burying layers.

17. The semiconductor laser device of claim 8, further comprising, on a side of the modulator section opposite to that facing the laser section, a spot-size converter section in which a width or a layer thickness of a waveguide layer varies along the optical axis of the laser light;

wherein the spot-size converter section has: a fourth mesa stripe which is provided as a mesa formed on the semiconductor substrate and extending in the direction of the optical axis, and which includes said waveguide layer; semi-insulative burying layers which are placed to abut on both side surfaces of the fourth mesa stripe and are formed on the semiconductor substrate; and a p-type cladding layer which covers surfaces of the semi-insulative burying layers and the fourth mesa stripe.

18. The semiconductor laser device of claim 8, further comprising, on a side of the modulator section opposite to that facing the laser section, a spot-size converter section in which a width or a layer thickness of a waveguide layer varies along the optical axis of the laser light;

wherein the spot-size converter section has: a fourth mesa stripe which is provided as a mesa formed on the semiconductor substrate and extending in the direction of the optical axis, and which includes said waveguide layer; semi-insulative burying layers which are placed to abut on both side surfaces of the fourth mesa stripe and are formed on the semiconductor substrate; n-type burying layers which are formed on respective surfaces of the semi-insulative burying layers but are placed only in regions thereon adjacent to the fourth mesa stripe; and a p-type cladding layer which covers surfaces of the semi-insulative burying layers, the n-type burying layers and the fourth mesa stripe.

19. The semiconductor laser device of claim 8, wherein the n-type burying layers in the laser section are n-type InP burying layers.

20. The semiconductor laser device of claim 8, wherein the n-type burying layers in the laser section are n-type AlInAs burying layers.

* * * * *